(12) United States Patent
Dhar et al.

(10) Patent No.: US 9,478,616 B2
(45) Date of Patent: Oct. 25, 2016

(54) SEMICONDUCTOR DEVICE HAVING HIGH PERFORMANCE CHANNEL

(75) Inventors: Sarit Dhar, Cary, NC (US); Sei-Hyung Ryu, Cary, NC (US); Lin Cheng, Chapel Hill, NC (US); Anant Agarwal, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 981 days.

(21) Appl. No.: 13/039,441

(22) Filed: Mar. 3, 2011

(65) Prior Publication Data

US 2012/0223330 A1   Sep. 6, 2012

(51) Int. Cl.
*H01L 29/15* (2006.01)
*H01L 31/0312* (2006.01)
*H01L 29/10* (2006.01)
*H01L 21/225* (2006.01)
*H01L 29/16* (2006.01)
*H01L 29/66* (2006.01)

(52) U.S. Cl.
CPC ........... *H01L 29/107* (2013.01); *H01L 21/225* (2013.01); *H01L 29/1608* (2013.01); *H01L 29/66068* (2013.01); *H01L 29/66477* (2013.01); *H01L 29/66568* (2013.01)

(58) Field of Classification Search
CPC ........................... H01L 29/15; H01L 31/0312
See application file for complete search history.

(56) References Cited

U.S. PATENT DOCUMENTS

| | | | |
|---|---|---|---|
| 5,141,895 A | 8/1992 | Pfiester et al. | |
| 5,153,146 A | 10/1992 | Toyoshima et al. | |
| 6,103,580 A | 8/2000 | Guo | |
| 6,461,947 B1 | 10/2002 | Uematsu et al. | |
| 2002/0038891 A1 | 4/2002 | Ryu et al. | |
| 2002/0151129 A1 | 10/2002 | Yoshida et al. | |
| 2004/0087093 A1* | 5/2004 | Fukuda et al. | 438/301 |

(Continued)

FOREIGN PATENT DOCUMENTS

| | | |
|---|---|---|
| JP | H06236967 A | 8/1994 |
| JP | 2001077112 A | 3/2001 |

(Continued)

OTHER PUBLICATIONS

Nishiuchi et al., "A normally-off type buried channel MOSFET for VLSI circuits," International Electron Devices Meeting, Washington, Dec. 4-6, 1978, pp. 26-29.

(Continued)

*Primary Examiner* — Marvin Payen
(74) *Attorney, Agent, or Firm* — Anthony J. Josephson

(57) ABSTRACT

Semiconductor devices having a high performance channel and method of fabrication thereof are disclosed. Preferably, the semiconductor devices are Metal-Oxide-Semiconductor (MOS) devices, and even more preferably the semiconductor devices are Silicon Carbide (SiC) MOS devices. In one embodiment, a semiconductor device includes a SiC substrate of a first conductivity type, a first well of a second conductivity type, a second well of the second conductivity type, and a surface diffused channel of the second conductivity type formed at the surface of semiconductor device between the first and second wells. A depth and doping concentration of the surface diffused channel are controlled to provide increased carrier mobility for the semiconductor device as compared to the same semiconductor device without the surface diffused channel region when in the on-state while retaining a turn-on, or threshold, voltage that provides normally-off behavior.

46 Claims, 18 Drawing Sheets

(56) References Cited

U.S. PATENT DOCUMENTS

| | | |
|---|---|---|
| 2004/0127000 A1 | 7/2004 | Colombo et al. |
| 2007/0145377 A1 | 6/2007 | Miura |
| 2007/0241367 A1 | 10/2007 | Ouyang et al. |
| 2010/0264506 A1 | 10/2010 | Evrard et al. |

FOREIGN PATENT DOCUMENTS

| | | |
|---|---|---|
| JP | 2003031802 A | 1/2003 |
| JP | 2004327675 A | 11/2004 |
| JP | 2005166930 A | 6/2005 |
| JP | 2006100357 A | 4/2006 |
| JP | 2009043880 A | 2/2009 |
| TW | 377508 | 4/1985 |

OTHER PUBLICATIONS

Invitation to Pay Additional Fees and where Applicable, Protest Fee for PCT/US2012/020494 mailed Mar. 19, 2012, 8 pages.

Moscatelli, Francesco et al., "Nitrogen Implantation to Improve Electron Channel Mobility in 4H-SiC MOSFET," IEEE Transactions on Electron Devices, Apr. 2008, vol. 55, No. 4, IEEE.

Okamoto, Dai et al., "Improved Inversion Channel Mobility in Si-face 4H-SiC MOSFETs by Phosphorus Incorporation Technique," MRS Spring Meeting 2010, Apr. 2010, Materials Research Society.

"PDS Phosphorous Planar Diffusion Source," MSDS No. 700, Jul. 13, 2009, Saint-Gobain Advanced Ceramics.

"PDS Phosphorous Planar Diffusion Source," MSDS No. 701, Jul. 13, 2009, Saint-Gobain Advanced Ceramics.

"PDS Products Phosphorus N-Type Source Wafers," PDS Products Technical Data, Feb. 2006, Saint-Gobain Advanced Ceramics.

"PhosPlus High-Purity Planar Dopant Sources," Brochure, (c) 2000, Techneglas, Inc.

"Silicon Boron Layer (Si-B) & Low Temperature Oxidation," Boron Nitride Grade PDF Products Technical Bulletin, Sep. 2002, Saint-Gobain Advanced Ceramics.

International Preliminary Report on Patentability for PCT/US2012/020494, mailed Sep. 12, 2013, 10 pages.

Office Action for Taiwanese Patent Application No. 101101484, mailed Sep. 1, 2014, 10 pages.

Reason for Rejection for Japanese Patent Application No. 2013-556620, mailed May 7, 2015, 14 pages.

Examination Report for European Patent Application No. 12701557.6, mailed Oct. 5, 2015, 6 pages.

Final Decision of Rejection for Japanese Patent Application No. 2013-556620, mailed Mar. 29, 2016, 8 pages.

\* cited by examiner

SEMICONDUCTOR DEVICE HAVING HIGH PERFORMANCE CHANNEL

This invention was made with government funds under contract number W911NF-04-2-0021 awarded by Army Research Laboratory. The U.S. Government may have rights in this invention.

FIELD OF THE DISCLOSURE

The present disclosure relates to semiconductor devices, and more particularly relates to a Metal-Oxide-Semiconductor (MOS) device, and even more particularly relates to a Silicon Carbide (SiC) MOS device having a high performance channel.

BACKGROUND

FIG. 1 illustrates a conventional Silicon Carbide (SiC) Metal-Oxide-Semiconductor Field Effect Transistor (MOSFET) 10. As illustrated, the SiC MOSFET 10 includes a p-type SiC substrate 12 which is conventionally 4H-SiC, a first n+ well 14 forming a source region of the SiC MOSFET 10, a second n+ well 16 forming a drain region of the SiC MOSFET 10, and a gate oxide 18 arranged as shown. A metal source contact 20 is formed over the first n+ well 14 to provide a source contact for the SiC MOSFET 10. Likewise, a metal drain contact 22 is formed over the second n+ well 16 to provide a drain contact for the SiC MOSFET 10. Lastly, a gate contact 24 is formed on the gate oxide 18. The gate contact 24 may be formed of polysilicon or a metal such as, for example, Aluminum (Al). In operation, when a positive gate voltage is applied to the gate contact 24, an n-type inversion channel is created between the n+ wells 14 and 16 forming the source and drain regions of the SiC MOSFET 10. When the gate voltage is greater than a turn-on, or threshold, voltage of the SiC MOSFET 10, current flows from the source region to the drain region of the SiC MOSFET 10.

One issue with the SiC MOSFET 10 is that it has low current when in the on-state due to: (1) low electron mobility in SiC in the range of less than 5 $cm^2V^{-1}s^{-1}$ and (2) dangling bonds and surface traps near the interface of the SiC substrate 12 and the gate oxide 18. As a result, an on-resistance of the SiC MOSFET 10 is high. One approach to increase electron mobility in a MOSFET is to form an n-type (for n-channel MOSFET) counter-doped or buried channel at the surface of the substrate between the source and drain regions of the MOSFET, where the counter-doped channel is formed via ion implantation into the surface of the substrate or epitaxial growth (i.e., regrowth). However, while these conventional counter-doped or buried channels increase carrier mobility, they also substantially decrease the turn-on, or threshold voltage, of the MOSFET. Specifically, for the same counter-doped or buried channel thickness, the threshold voltage decreases as the doping concentration of the counter-doped or buried channel increases. As such, these conventional counter-doped or buried channels are not acceptable for high power SiC MOS devices, which must be normally-off devices (i.e., have significantly positive turn-on, or threshold, voltages).

Thus, there is a need for a MOS device, and method of fabrication thereof, that has high channel current when in an on-state while retaining normally-off behavior.

SUMMARY

Semiconductor devices having a high performance channel and method of fabrication thereof are disclosed. Preferably, the semiconductor devices are Metal-Oxide-Semiconductor (MOS) devices, and even more preferably the semiconductor devices are Silicon Carbide (SiC) MOS devices. In one embodiment, a semiconductor device includes a SiC substrate of a first conductivity type, a first well of a second conductivity type, a second well of the second conductivity type, and a surface diffused channel of the second conductivity type formed at the surface of the semiconductor device between the first and second wells. A depth and doping concentration of the surface diffused channel are controlled to provide increased carrier mobility for the semiconductor device as compared to the same semiconductor device without the surface diffused channel when in the on-state while retaining normally-off behavior. In one embodiment, the semiconductor device is an n-channel device, and the surface diffused channel is formed by diffusing Phosphorus (P) into the surface of the SiC substrate. In one preferred embodiment, the P is diffused into the surface of the SiC substrate through an insulation layer formed on the surface of the SiC substrate from a $P_2O_5$ source.

In another embodiment, a semiconductor device includes a SiC substrate of a first conductivity type, a first well of a second conductivity type, a second well of the second conductivity type, and a surface diffused channel of the second conductivity type formed at the surface of the semiconductor device between the first and second wells by diffusing a first group III/V element into the surface of the SiC substrate, depending on whether the semiconductor device is a p-type or n-type channel device. The semiconductor device also includes a control contact oxide (e.g., a gate oxide) over the surface diffused channel into which one or more second group III/V elements are incorporated. In one embodiment, the semiconductor device is an n-type channel device, and the first and second group III/V elements are first and second group V elements such as, for example, P, Nitrogen (N), Arsenic (As), Antimony (Sb), or Bismuth (Bi). In one preferred embodiment, the first group V element diffused into the surface of the SiC substrate to form the surface diffused channel is P, and the one or more second group V elements incorporated into the control contact oxide include N.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 2:
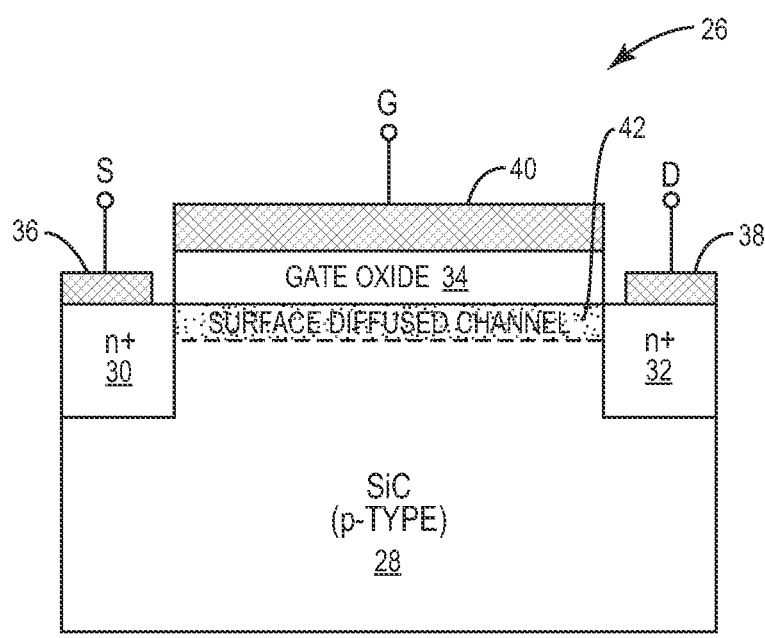
FIG. 2 illustrates a high performance MOS device, and particularly a high performance SiC MOSFET, according to one embodiment of the present disclosure.
Figure 3A:
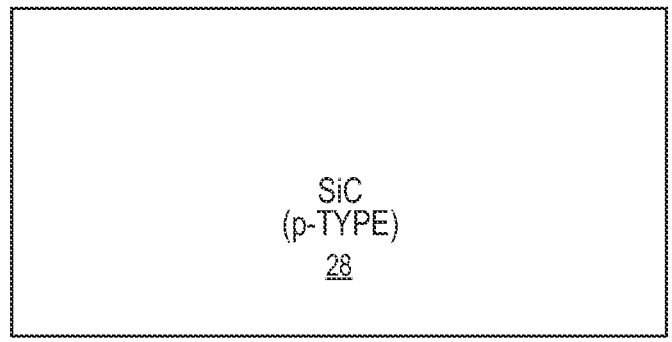
Figure 3B:
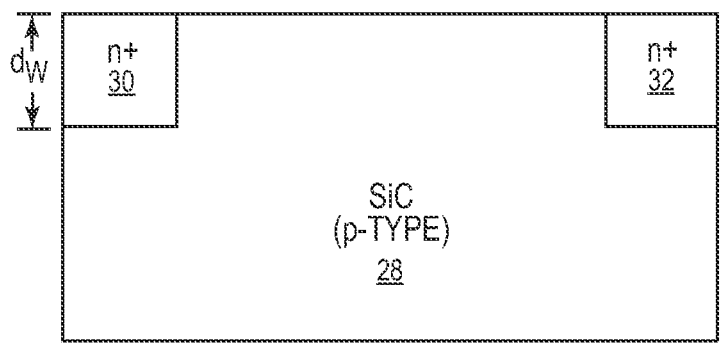
Figure 3C:
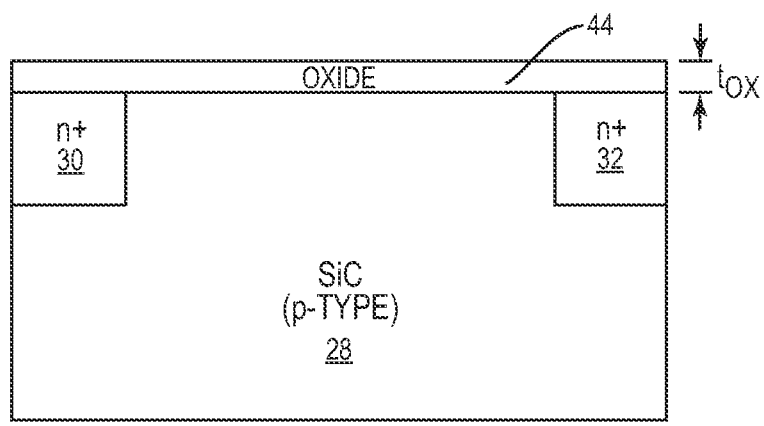
Figure 3D:
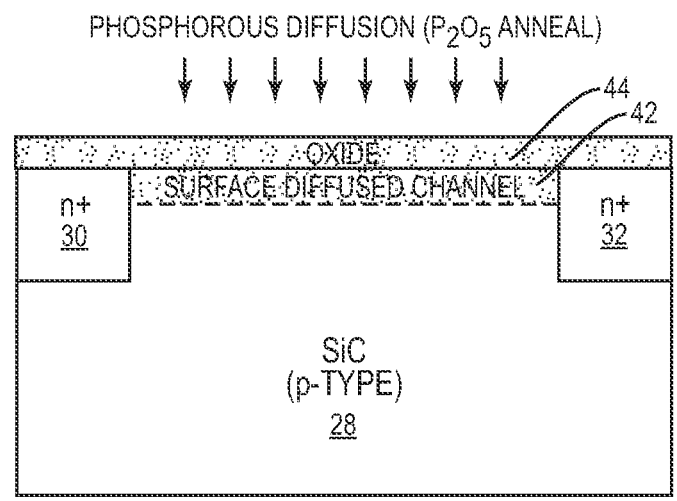
Figure 3E:
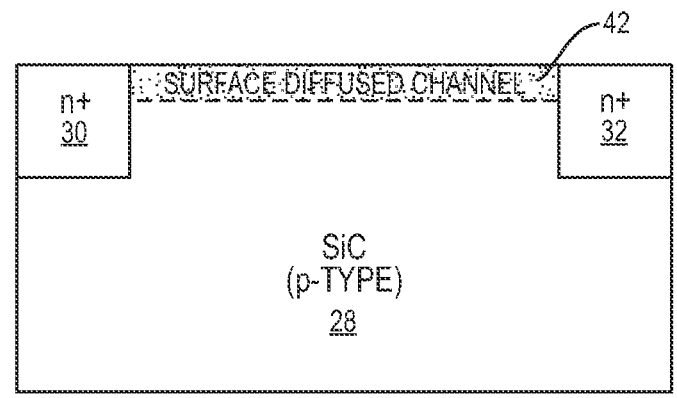
Figure 3F:
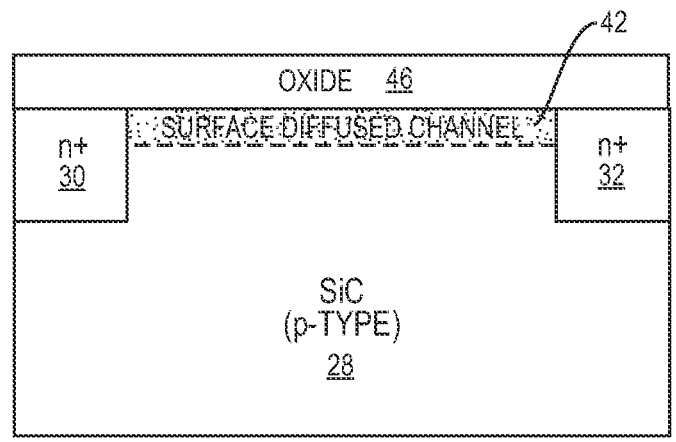
Figure 3G:
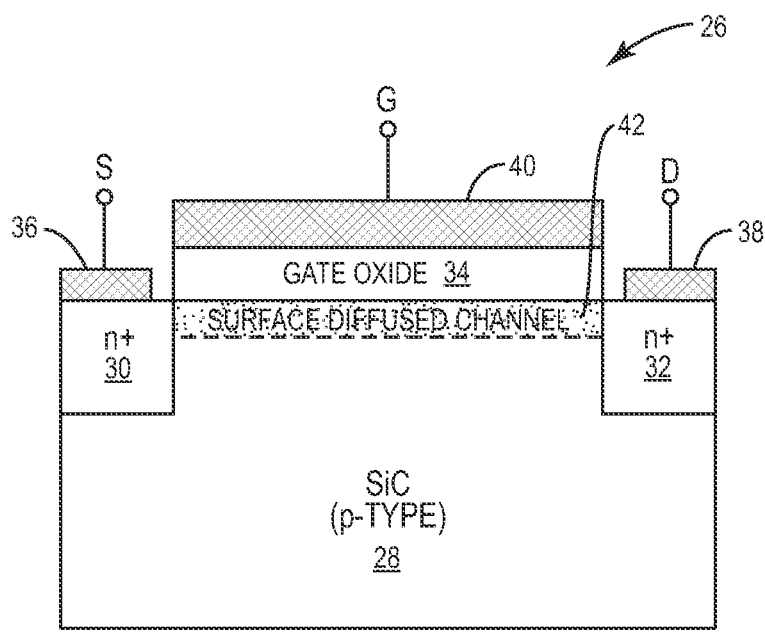
Figure 4:
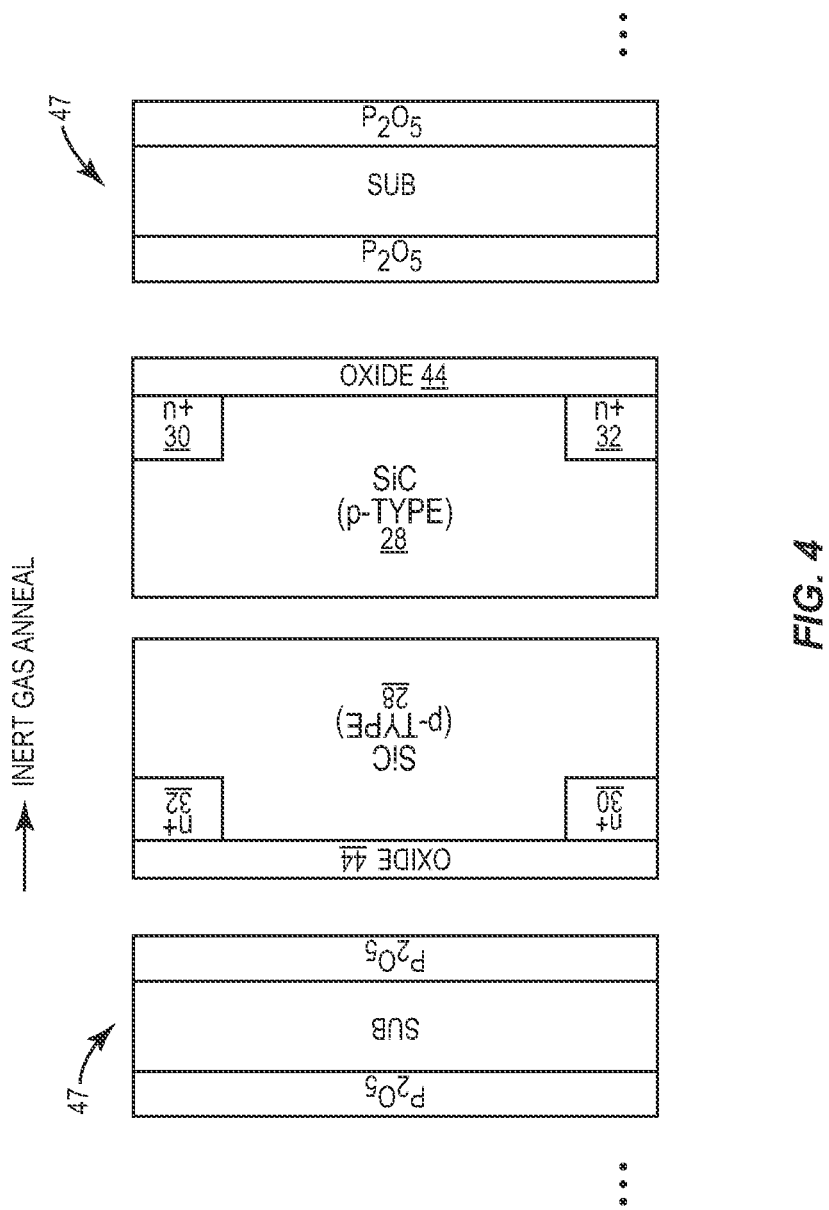
Figure 5:
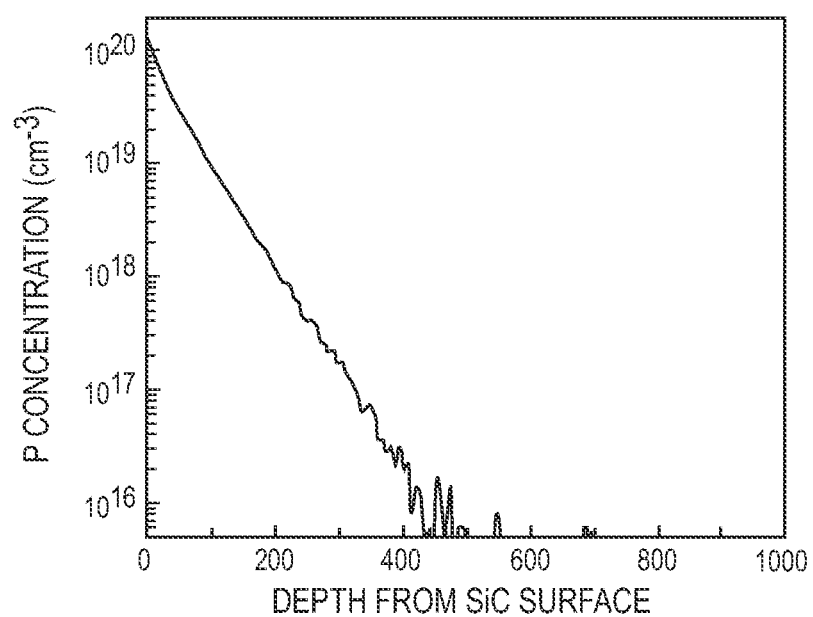
Figure 9:
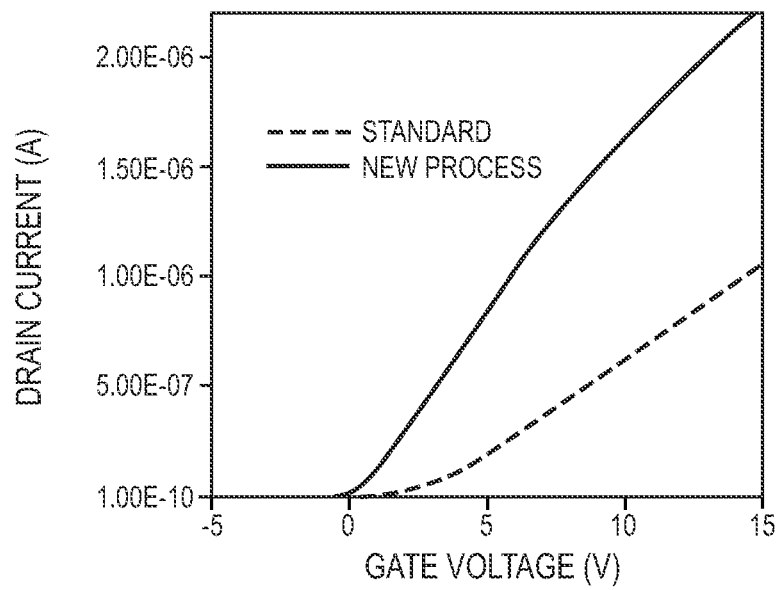
Figure 10:
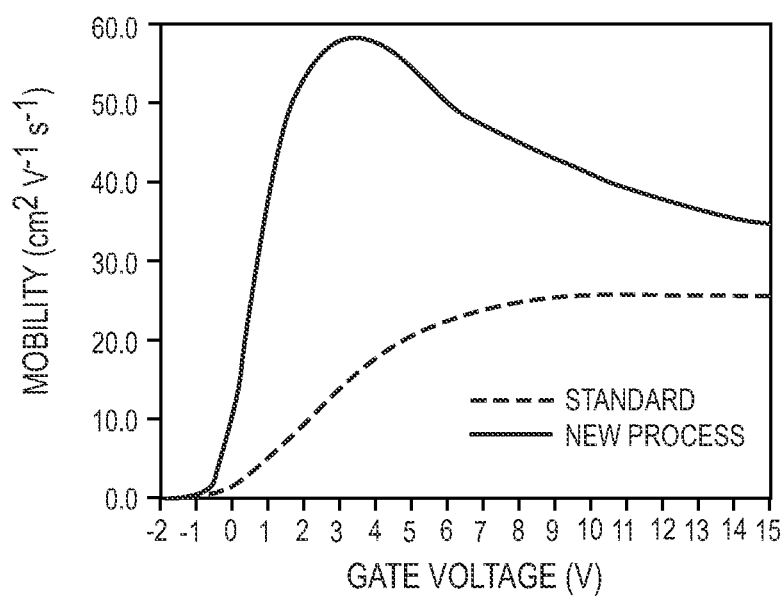
Figure 11:
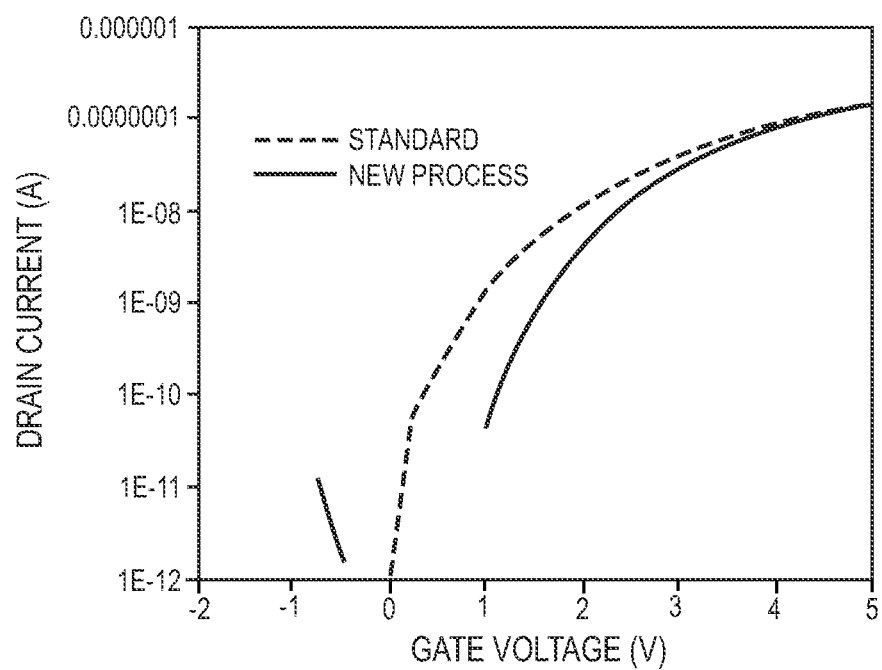
Figure 12:
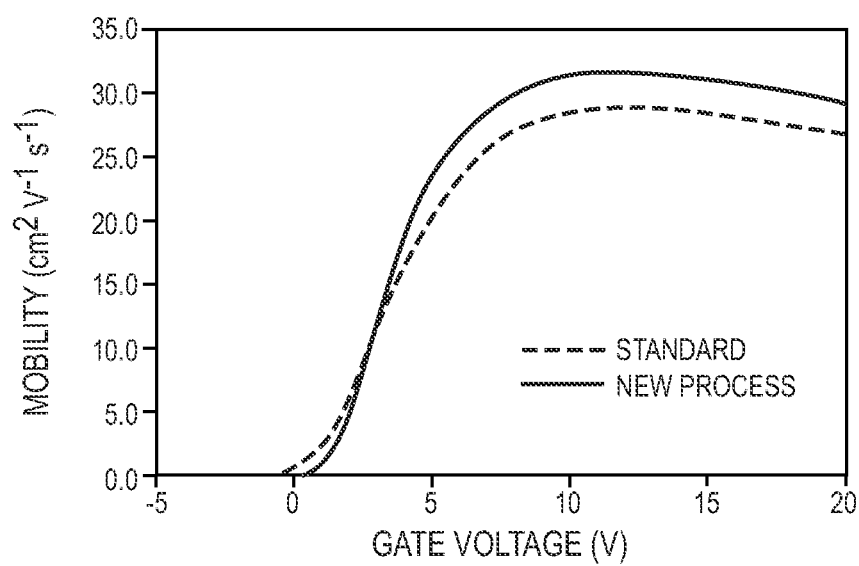

FIGS. 3A through 3G graphically illustrate a process for fabricating the SiC MOSFET of FIG. 2 according to one embodiment of the present disclosure;

FIG. 4 graphically illustrates diffusion of phosphorus into a surface of the SiC substrate of the SiC MOSFET during the fabrication process of FIGS. 3A through 3G in more detail according to one embodiment of the present disclosure;

FIG. 5 graphically illustrates experimental results showing the diffusion of Phosphorus (P) into the SiC substrate of the SiC MOSFET to form a surface diffused channel according to one specific exemplary embodiment of the present disclosure;

FIGS. 6A through 6H graphically illustrate a process for fabricating the SiC MOSFET of FIG. 2 according to another embodiment of the present disclosure;

FIGS. 7A through 7F graphically illustrate a process for fabricating the SiC MOSFET of FIG. 2 according to another embodiment of the present disclosure;

FIGS. 8A through 8F graphically illustrate a process for fabricating the SiC MOSFET of FIG. 2 according to yet another embodiment of the present disclosure;

FIG. 9 graphically illustrates the carrier mobility of the SiC MOSFET of FIG. 2 according to one exemplary embodiment of the present disclosure;

FIG. 10 graphically illustrates the drain current of the SiC MOSFET of FIG. 2 according to one exemplary embodiment of the present disclosure;

FIG. 11 graphically illustrates the carrier mobility of the SiC MOSFET of FIG. 2 according to another exemplary embodiment of the present disclosure; and FIG. 12 graphically illustrates the drain current of the SiC MOSFET of FIG. 2 according to another exemplary embodiment of the present disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

High performance Metal-Oxide-Semiconductor (MOS) devices and methods of fabrication thereof are disclosed. Preferably, the MOS devices are Silicon Carbide (SiC) MOS devices. However, the present disclosure is not limited thereto. As described below in detail, in one embodiment, a MOS device includes a surface diffused channel layer having a depth and doping concentration that are controlled to significantly improve the channel mobility of the MOS device while retaining normally-off behavior. As used herein, a MOS device is normally-off if the MOS device conducts less than or equal to $\frac{1}{10,000}$th of the rated current of the MOS device when zero volts (0 V) is applied to a control contact (e.g., a gate contact) of the MOS device. In another embodiment, a combination of group III or group V elements are incorporated into a control contact insulator (e.g., gate oxide), depending on whether the MOS device is a p-channel or n-channel device (i.e., a combination of group III elements for p-channel MOS devices or a combination of group V elements for n-channel MOS devices). The combination of group III/V elements incorporated into the control contact insulator increases an on-state current of the MOS device, thereby decreasing an on-resistance of the MOS device. As part of the incorporation of the group III/V elements into the control contact oxide, a surface diffused channel may be formed in the MOS device, where the depth and doping concentration for the surface diffused channel are controlled to increase the channel mobility of the MOS device while retaining normally-off behavior.

FIG. 2 illustrates a SiC Metal-Oxide-Semiconductor Field Effect Transistor (MOSFET) 26 according to one embodiment of the present disclosure. Note that while the following discussion focuses on the SiC MOSFET 26, the present disclosure is not limited thereto. The concepts described herein for improving the performance of the SiC MOSFET 26 are equally applicable to other types of MOS devices (e.g., vertical MOSFETs, lateral MOSFETs, power MOSFETs, low power MOSFETs such as those for logic and/or analog circuits, Insulated Gate Bipolar Transistors (IGBTs), MOS controlled thyristors, or the like). Further, while the discussion herein focuses on the use of SiC, and specifically 4H-SiC, as the substrate for the MOS device, the present disclosure is not limited thereto.

As illustrated, the SiC MOSFET 26 includes a p-type SiC substrate 28, a first n+ well 30 forming a source region of the SiC MOSFET 26, a second n+ well 32 forming a drain region of the SiC MOSFET 26, and a gate oxide 34 arranged as shown. In this embodiment, the SiC MOSFET 26 is an n-channel device (i.e., has a p-type substrate and n-type channel). The SiC substrate 28 is preferably formed of 4H-SiC. Also, the SiC substrate 28 may have any suitable doping level such as, for example, a doping level in the range of and including 1e15 to 1e18 $cm^{-3}$. A metal source contact 36 is formed over the first n+ well 30 to provide a source contact for the SiC MOSFET 26. Likewise, a metal drain contact 38 is formed over the second n+ well 32 to provide a drain contact for the SiC MOSFET 26. The source and drain contacts 36 and 38 are ohmic contacts. A gate contact 40 is formed on the gate oxide 34. The gate contact 40 may be formed of polysilicon (e.g., Phosphorus (P) doped polysilicon) or a metal (e.g., Aluminum (Al)).

Figure 1:
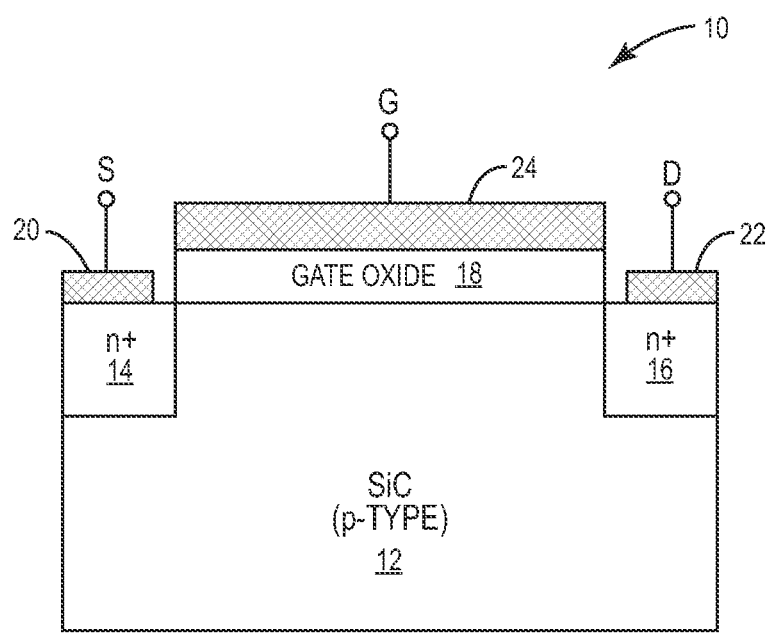
FIG. 1 illustrates a conventional Silicon Carbide (SiC) Metal-Oxide-Semiconductor Field Effect Transistor (MOSFET)

As described below in detail, the SiC MOSFET 26 also includes a surface diffused channel 42. The surface diffused channel 42 is a region of the SiC substrate 28 that has been counter-doped to n-type (i.e., a region of the SiC substrate 28 that has been counter-doped from p-type to n-type) via diffusion of a desired dopant into the surface of the SiC substrate 28. A depth of the surface diffused channel 42 into the SiC substrate 28 and a doping concentration of the surface diffused channel 42 are controlled such that the carrier mobility in the channel of the SiC MOSFET 26 is substantially increased as compared to that of the same SiC MOSFET without the surface diffused channel 42 while retaining normally-off behavior. More specifically, the surface diffused channel 42 is formed such that the surface diffused channel 42 is thin (e.g., less than 1000 Angstroms or more preferably less than 500 Angstroms) and has a high doping concentration (e.g., greater than 5e17 $cm^{-3}$). Because the surface diffused channel 42 is thin and has a high doping concentration, the surface diffused channel 42 substantially increases the carrier mobility of the SiC MOSFET 26 as compared to that of conventional SiC MOSFETs (e.g., the SiC MOSFET 10 of FIG. 1) while maintaining normally-off behavior (i.e., having a significantly positive turn-on, or threshold, voltage). In one embodiment, the carrier mobility of the SiC MOSFET 26 is increased to greater than about 50 $cm^2V^{-1} s^{-1}$ while retaining normally-off behavior.

In the preferred embodiment, the surface diffused channel 42 has a dose (i.e., depth×doping concentration) in the range of and including 5e11 $cm^{-2}$ to 5e13 $cm^{-2}$. Even more preferably, the surface diffused channel 42 has a dose (i.e., depth×doping concentration) in the range of and including 5e11 $cm^{-2}$ to 5e13 $cm^{-2}$ and the depth of the surface diffused channel 42 is less than or equal to 500 Angstroms. Typically, for the same depth, the threshold voltage of the SiC MOSFET 26 decreases as the doping concentration increases, which in turn causes the SiC MOSFET 26 to move away from normally-off behavior. However, the inventors have found that when the depth of the surface diffused channel 42 is less than or equal to 500 Angstroms, the threshold voltage of the SiC MOSFET 26 is significantly less affected by changes in the doping concentration. As such, when the depth of the surface diffused channel 42 is less than or equal to 500 Angstroms, the doping concentration of the surface diffused channel 42, and thus the carrier mobility of the SiC MOSFET 26, can be increased without significantly affecting the threshold voltage of the SiC MOSFET 26 such that normally-off behavior is maintained.

In one exemplary embodiment, the first and second n+ wells 30 and 32 extend from the surface of the SiC substrate 28 to a depth in the range of and including 2000 Angstroms to 3000 Angstroms and have a doping concentration in the range of and including 1e19 $cm^{-3}$ to 1e21 $cm^{-3}$, and the surface diffused channel 42 extends from the surface of the SiC substrate 28 to a depth of less than 1000 Angstroms and has a doping concentration greater than 1 e18 cm–3 such that the dose of the surface diffused channel 42 is in the range of and including 5e11 $cm^{-2}$ to 5e13 $cm^{-2}$. In another exemplary embodiment, the first and second n+ wells 30 and 32 extend from the surface of the SiC substrate 28 to a depth in the range of and including 2000 Angstroms to 3000 Angstroms and have a doping concentration in the range of and including 1e19 $cm^{-3}$ to 1e21 $cm^{-3}$, and the surface diffused channel 42 extends from the surface of the SiC substrate 28 to a depth of less than 500 Angstroms with a doping concentration greater than 1e18 cm–3 such that the dose of the surface diffused channel 42 is in the range of and including 5e11 $cm^{-2}$ to 5e13 $cm^{-2}$. In another exemplary embodiment, the surface diffused channel 42 has a depth of about 400 Angstroms and a doping concentration greater than 1e18 $cm^{-3}$ such that the dose of the surface diffused channel 42 is in the range of and including 5e11 $cm^{-2}$ to 5e13 $cm^{-2}$. Particularly in SiC, such a thin and highly doped counter-doped or buried channel is extremely difficult to obtain using conventional techniques (i.e., ion implantation or epitaxial regrowth). Note that there is no theoretical minimum depth for the surface diffused channel 42. However, from a practical standpoint and in one exemplary embodiment, the surface diffused channel 42 has a minimum depth of about 300 Angstroms. It should be noted that, in the aforementioned exemplary embodiments, the doping concentration of the surface diffused channel 42 is greater than 1e18 $cm^{-3}$. However, in yet another embodiment, the doping concentration of the surface diffused channel 42 is greater than 5e17 $cm^{-3}$.

FIGS. 3A through 3G graphically illustrate a process for fabricating the SiC MOSFET 26 of FIG. 2 according to a first embodiment of the present disclosure. The process starts with the SiC substrate 28 as illustrated in FIG. 3A. In this embodiment, the SiC substrate 28 is a p-type 4H-SiC substrate having a doping concentration in the range of and including 1e15 $cm^{-3}$ to 1e18 $cm^{-3}$. The first and second n+ wells 30 and 32 are formed in the SiC substrate 28 via ion implantation as illustrated in FIG. 3B. Again, the first and second n+ wells 30 and 32 form the source and drain regions of the SiC MOSFET 26. In this embodiment, the first and second n+ wells 30 and 32 have a depth ($d_w$) in the range of and including 2000 Angstroms to 3000 Angstroms. However, the present disclosure is not limited thereto. Other depths may be used depending on the particular implementation as will be appreciated by one of ordinary skill in the art upon reading this disclosure. Further, in this embodiment, the first and second n+ wells 30 and 32 have a doping concentration in the range of and including 1e19 $cm^{-3}$ to 1e21 $cm^{-3}$.

Next, an oxide layer 44 is formed on the surface of the SiC substrate 28 as illustrated in FIG. 3C. Note that while an oxide layer 44 is used in the embodiments described herein, other types of insulating materials, or insulators, may be used. For example, rather than using the oxide layer 44, a layer of high-K dielectric material may be used. A thickness ($t_{OX}$) is preferably a predetermined thickness selected to control a depth of the surface diffused channel 42 of the SiC MOSFET 26, as described below. In one embodiment, the oxide layer 44 is a Silicon Dioxide ($SiO_2$) layer formed via a thermal oxidation process. In another embodiment, the oxide layer 44 is deposited via a deposition process such as, for example, Low Pressure Chemical Vapor Deposition (LPCVD), Plasma-Enhanced Chemical Vapor Deposition (PECVD), Atomic Layer Deposition (ALD), or the like. Further, while the thickness ($t_{OX}$) of the oxide layer 44 may vary, in one exemplary embodiment, the thickness ($t_{OX}$) of the oxide layer 44 is 300 Angstroms to 1000 Angstroms. In another exemplary embodiment, the thickness ($t_{OX}$) of the oxide layer 44 is about 500 Angstroms.

Next, P is diffused into the surface of the SiC substrate 28 through the oxide layer 44 to form the surface diffused channel 42 of the SiC MOSFET 26, as illustrated in FIG. 3D. Note that while P is diffused into the surface of the SiC substrate 28 in this embodiment, the present disclosure is not limited thereto. Some other group V element (e.g., Nitrogen (N) or Arsenic (As)) may alternatively be diffused into the SiC substrate 28 through the oxide layer 44 to form the surface diffused channel 42. In the preferred embodiment, P is diffused into the surface of the SiC substrate 28 by annealing the structure of FIG. 3D (i.e., the SiC substrate 28 and the oxide layer 44 formed on the SiC substrate 28) in a P rich environment. In one embodiment, the P rich environment is a $P_2O_5$ environment. In another embodiment, the P rich environment is a $POCl_3$ environment. Parameters of the annealing process such as, but not limited to, temperature and time are controlled along with the thickness ($t_{OX}$) of the oxide layer 44 such that the surface diffused channel 42 has a desired depth (i.e., thickness) and a desired doping concentration. The desired depth of the surface diffused channel 42 and the desired doping concentration are such that the surface diffused channel 42 significantly increases the carrier mobility of the SiC MOSFET 26 while retaining normally-off behavior. It should be noted that, in an alternative embodiment, the oxide layer 44 may be etched prior to diffusion of the P into the surface of the SiC substrate 28 such that diffusion of the P occurs through the etched surface of the SiC substrate 28.

After the surface diffused channel 42 is formed, the oxide layer 44 is P rich. In this embodiment, the oxide layer 44 is removed as illustrated in FIG. 3E. The oxide layer 44 may be removed using any suitable technique such as, but not limited to, etching. At this point, additional annealing at higher temperatures may be performed if further activation of the dopants is needed or desired. Additional annealing at high temperatures such as, for example, a temperature up to about 1300 degrees Celsius or 1400 degrees Celsius may also be used to cause the P to further diffuse into the SiC substrate 28. In this case, the temperature and amount of time for this post-diffusion annealing step may be an additional parameter that may be used to control the depth and doping concentration of the surface diffused channel 42.

A new oxide layer 46 is then formed on the surface of the SiC substrate 28, as illustrated in FIG. 3F. The new oxide layer 46 may be formed via deposition, thermal oxidation, or a combination thereof (e.g., thin thermally grown oxide in combination with a deposited oxide). The new oxide layer 46 may be, for example, $SiO_2$. However, other insulators may alternatively be used such as, for example, a high-K dielectric material. In this embodiment, fabrication of the SiC MOSFET 26 is then completed by etching the new oxide layer 46 to form the gate oxide 34 and then forming source, drain, and gate contacts 36, 38, and 40 using conventional processes, as illustrated in FIG. 3G. Again, the source and drain contacts 36 and 38 are preferably formed of a metal, and the gate contact 40 is preferably formed of a metal or polysilicon.

FIG. 4 illustrates a $P_2O_5$ annealing process for forming the surface diffused channel 42 according to one embodiment of the present disclosure. As illustrated, the $P_2O_5$ annealing process is performed by placing the semiconductor wafer of FIG. 3D (i.e., the SiC substrate 28 on which the oxide layer 44 has been formed) in a boat or similar mechanism such that the oxide layer 44 is adjacent to a $P_2O_5$ disk 47. The boat may be configured to accommodate multiple semiconductor wafers and $P_2O_5$ disks 47 as illustrated. The $P_2O_5$ disks 47 are typically composites of $P_2O_5$ and oxides of Si, Cerium (Ce), Lanthanum (La), Al, Tantalum (Ta), or the like. When heated, these materials decompose into $P_2O_5$ and other gaseous byproducts which diffuse away into the ambient. The boat is then placed in a furnace (e.g., a furnace tube) and heated to a predetermined temperature for a predetermined amount of time in the presence of an inert gas (e.g., $N_2$). Preferably, the predetermined temperature and predetermined amount of time are selected along with the thickness ($t_{OX}$) of the oxide layer 44 such that the surface diffused channel 42 resulting from the $P_2O_5$ annealing process has the desired depth and the desired doping concentration. In other words, the predetermined temperature and predetermined amount of time are selected such that P diffuses through the oxide layer 44 and into the surface of the SiC substrate 28 to the desired depth and at the desired doping concentration. The predetermined temperature may be, for example, in the range of and including 950 degrees Celsius to 1100 degrees Celsius. In one exemplary embodiment, the thickness ($t_{OX}$) of the oxide layer 44 is approximately 500 Angstroms and the $P_2O_5$ annealing process is performed at a temperature of 950 degrees Celsius for 4 hours, which results in the surface diffused channel 42 having a depth of approximately 400 Angstroms and a doping concentration greater than $1e18\ cm^{-3}$, as illustrated in FIG. 5.

FIGS. 6A through 6H graphically illustrate a process for fabricating the SiC MOSFET 26 of FIG. 2 according to a second embodiment of the present disclosure. In general, this process is the same as the process described above up until and through the formation of the new oxide layer 46. In this embodiment, a group V element, specifically N, is incorporated into the new oxide layer 46. Note that N is exemplary. Other types of group V elements (e.g., As, Sb, and/or Bi) may alternatively be incorporated into the new oxide layer 46. Further, a combination of two or more group V elements may be incorporated into the new oxide layer 46. The incorporation of N, or other group V element(s), into the new oxide layer 46 further increases the current of the SiC MOSFET 26 by reducing the number of dangling bonds and surface traps near the interface between the SiC substrate 28 and the gate oxide 34, which in turn reduces the on-resistance of the SiC MOSFET 26.

Figure 6A:
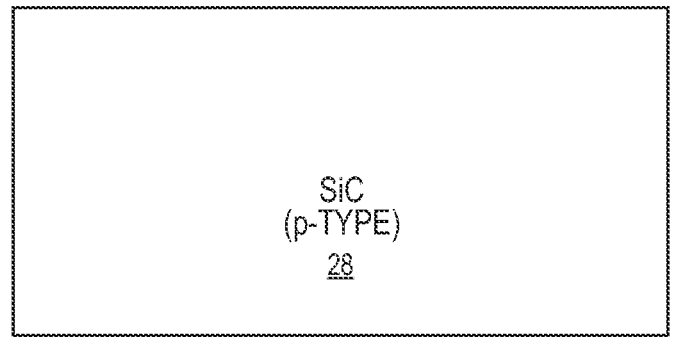
Figure 6B:
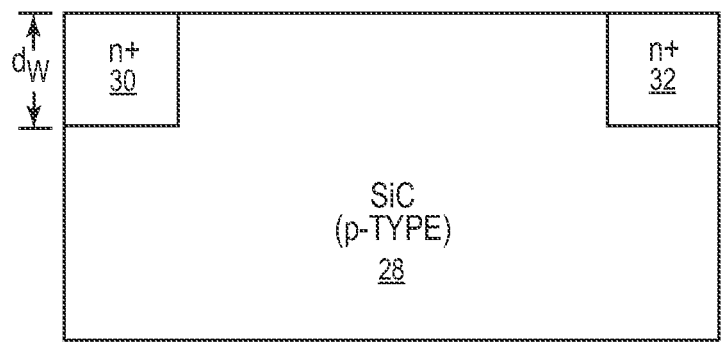
Figure 6C:
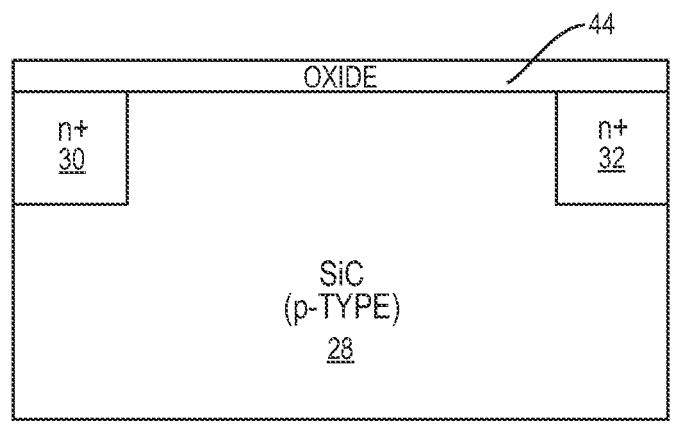
Figure 6D:
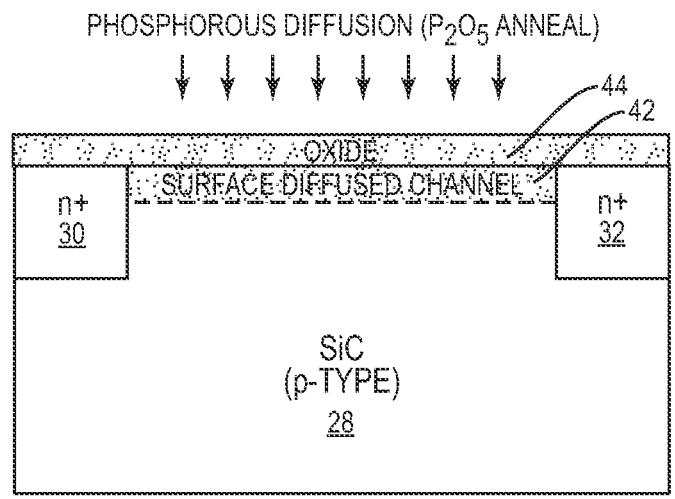
Figure 6E:
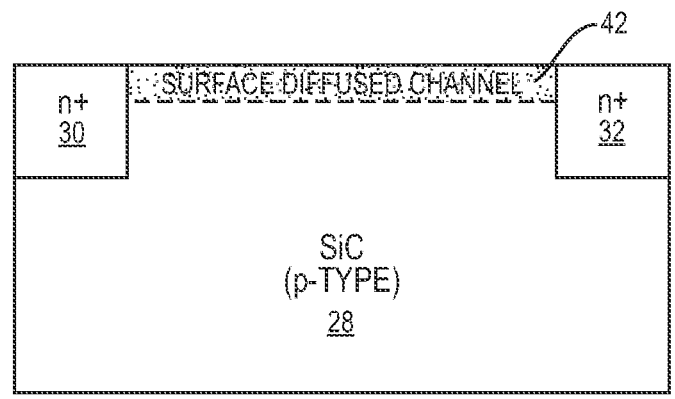
Figure 6F:
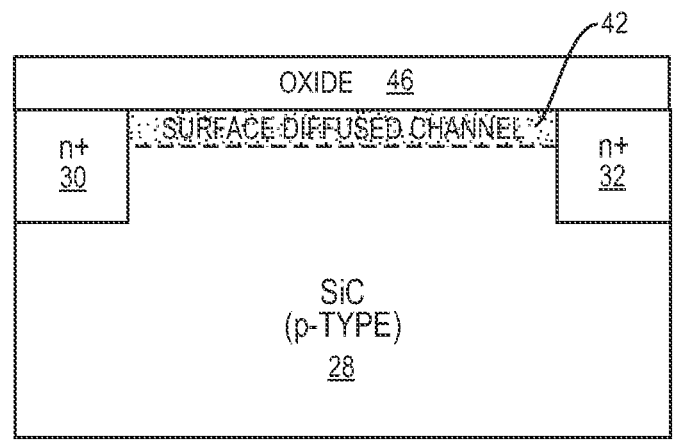
Figure 6G:
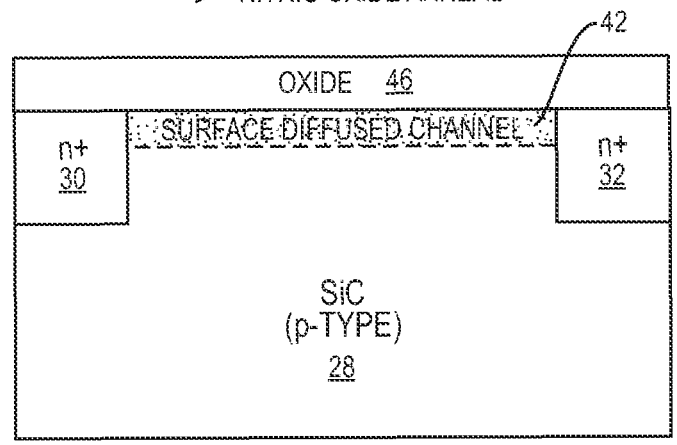
Figure 6H:
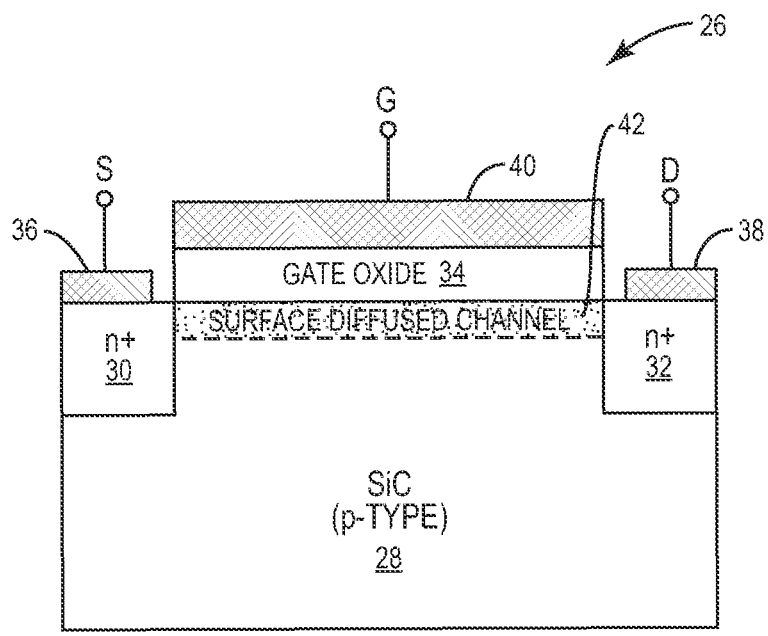

More specifically, first, as illustrated in FIGS. 6A through 6F, the fabrication process proceeds as described above with respect to FIGS. 3A through 3F to form the first and second n+ wells 30 and 32, the surface diffused channel 42, and the new oxide layer 46. Next, in this embodiment, the structure (i.e., the SiC substrate 28 including the new oxide layer 46 illustrated in FIG. 6G) is annealed in a N rich environment such that N is incorporated into the new oxide layer 46. In this particular embodiment, the structure is annealed in a Nitric Oxide (NO) environment at a temperature in the range of and including 1100 degrees Celsius to 1300 degrees Celsius for an amount of time that enables N to diffuse through the new oxide layer 46 to and possibly through the interface between the SiC substrate 28 and the new oxide layer 46. The N diffused into the new oxide layer 46 passivates dangling bonds and surface traps near the interface of the new oxide layer 46 and the SiC substrate 28. By passivating the dangling bonds and surface traps, the current of the resulting SiC MOSFET 26 when in the on-state is significantly increased. As an alternative to gas phase annealing, ion implantation may be used to incorporate N (or other group V element(s)) into the new oxide layer 46. Fabrication of the SiC MOSFET 26 is then completed by etching the new oxide layer 46 to form the gate oxide 34 and then forming the source, drain, and gate contacts 36, 38, and 40 using conventional processes, as illustrated in FIG. 6H. Again, the source and drain contacts 36 and 38 are preferably formed of a metal, and the gate contact 40 is preferably formed of a metal or polysilicon.

Figure 7A:
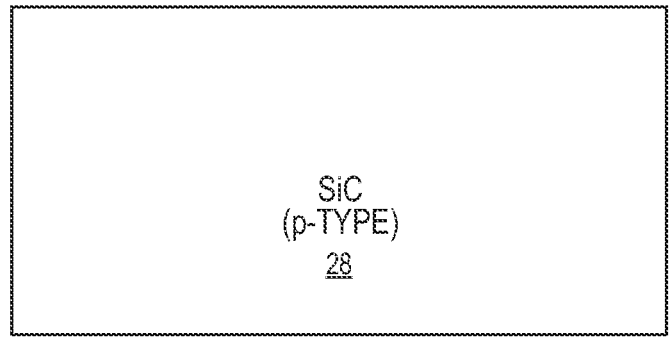
Figure 7B:
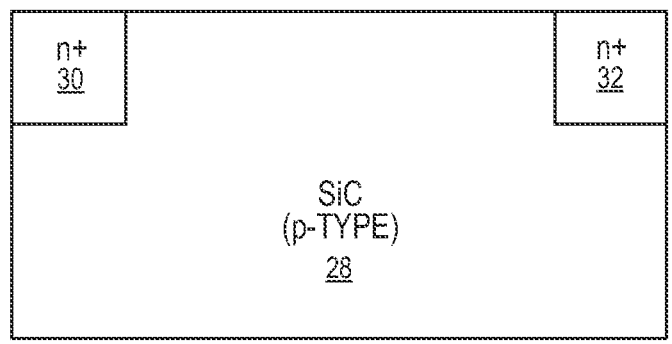
Figure 7C:
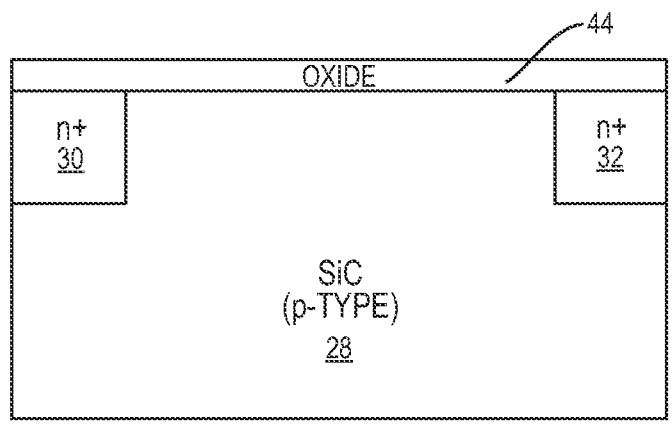
Figure 7D:
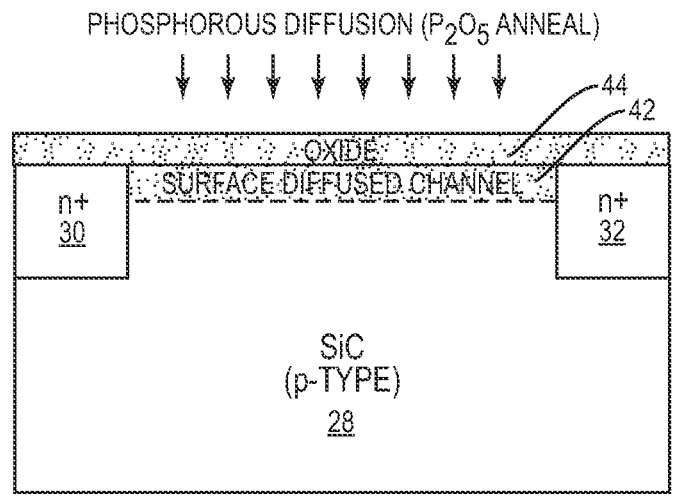
Figure 7E:
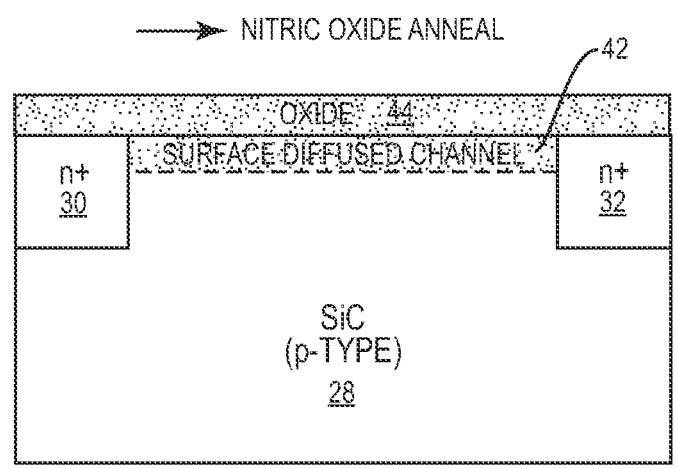

FIGS. 7A through 7F graphically illustrate a process for fabricating the SiC MOSFET 26 of FIG. 2 according to a third embodiment of the present disclosure. This embodiment is similar to that of FIGS. 6A through 6H, but the oxide layer 44, which after P diffusion is P rich, is used as the gate oxide 34 rather than depositing the new oxide layer 46. More specifically, first, as illustrated in FIGS. 7A through 7D, the first and second n+ wells 30 and 32 and the surface diffused channel 42 are formed as described above with respect to FIGS. 3A through 3D. Next, the structure of FIG. 7D is annealed in a N rich environment as illustrated in FIG. 7E. Notably, in this embodiment, the oxide layer 44, which is P rich due to the P diffusion to form the surface diffused channel 42, is to be used for the gate oxide 34 and as such is not removed and replaced with a new oxide layer. As a result, P is included in both the gate oxide 34 and in the SiC substrate 28 at the interface of the SiC substrate 28 and the gate oxide 34 (i.e., in the surface diffused channel 42).

Figure 7F:
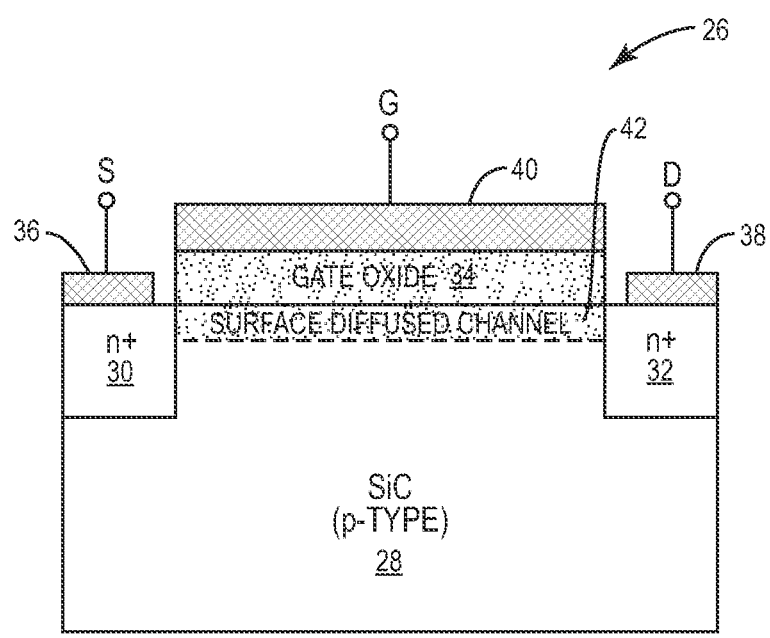

In this particular embodiment, the structure is annealed in a NO environment at a temperature in the range of and including 1100 degrees Celsius to 1300 degrees Celsius for an amount of time that enables N to diffuse through the oxide layer 44 to and possibly through the interface between the SiC substrate 28 and the oxide layer 44. The N diffused into the oxide layer 44 passivates dangling bonds and surface traps near the interface of the oxide layer 44 and the SiC substrate 28. By passivating the dangling bonds and surface traps, the current of the resulting SiC MOSFET 26 when in the on-state is significantly increased. Fabrication of the SiC MOSFET 26 is then completed by etching the oxide layer 44 to form the gate oxide 34 and then forming the source, drain, and gate contacts 36, 38, and 40 using conventional processes, as illustrated in FIG. 7F. Again, the source and drain contacts 36 and 38 are preferably formed of a metal, and the gate contact 40 is preferably formed of a metal or polysilicon.

FIGS. 8A through 8F graphically illustrate a process for fabricating the SiC MOSFET 26 of FIG. 2 according to a fourth embodiment of the present disclosure. This embodiment is similar to those of FIGS. 6A through 6H and FIGS. 7A through 7F, but where annealing in a N rich environment (e.g., an NO environment) is performed before diffusion of phosphorus into the surface of the SiC substrate 28 to form the surface diffused channel 42. Annealing in a N rich environment prior to P diffusion causes disruptions at the surface of the SiC substrate 28 which improve diffusion of the P into the SiC substrate 28.

Figure 8A:
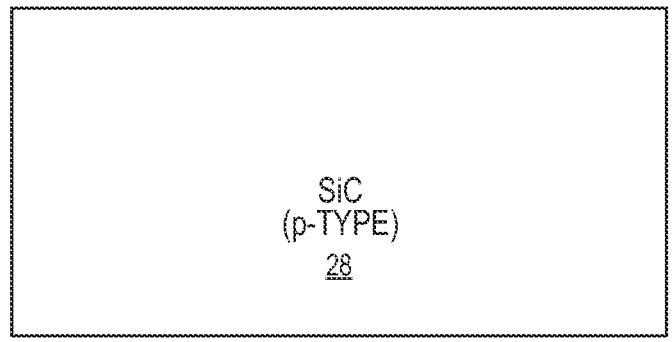
Figure 8B:
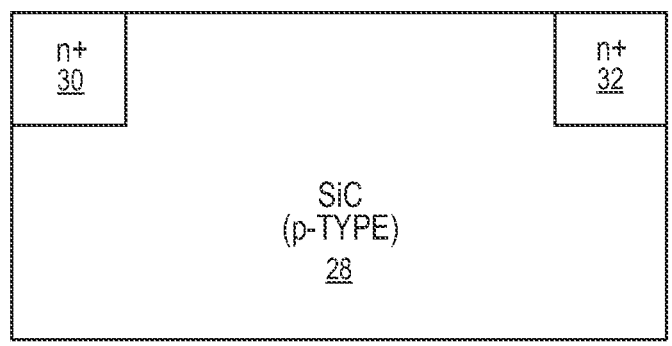
Figure 8C:
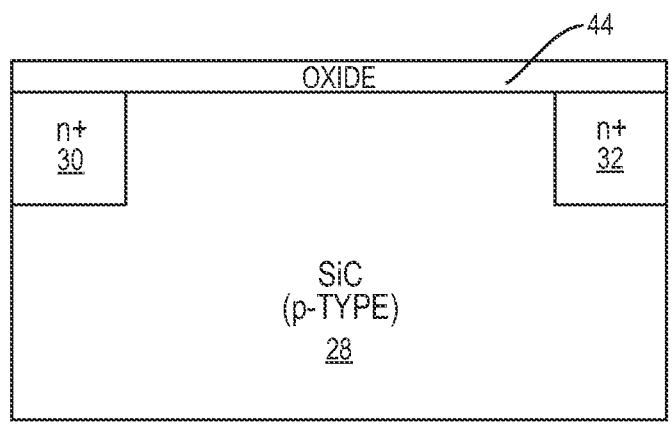
Figure 8D:
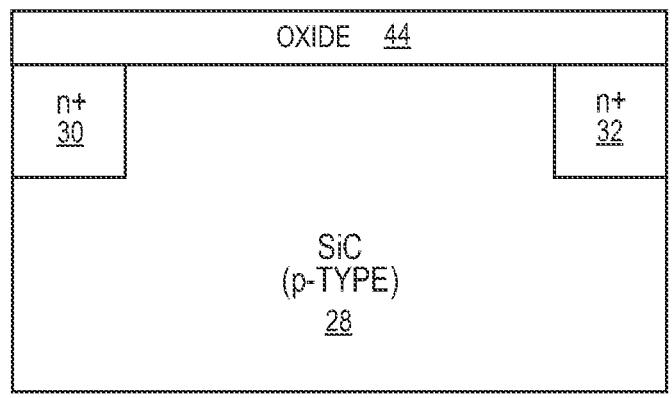
Figure 8E:
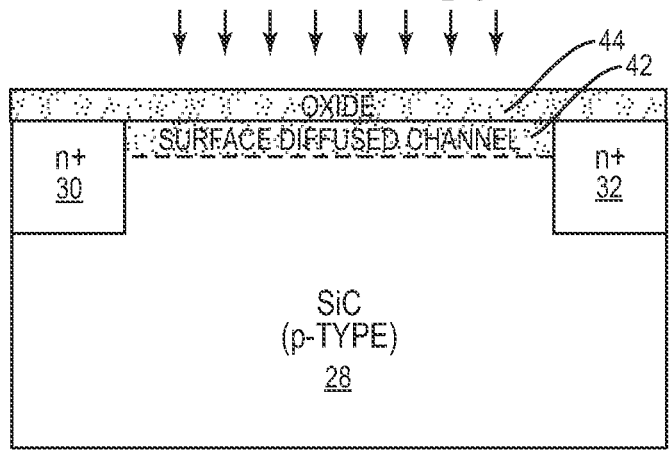
Figure 8F:
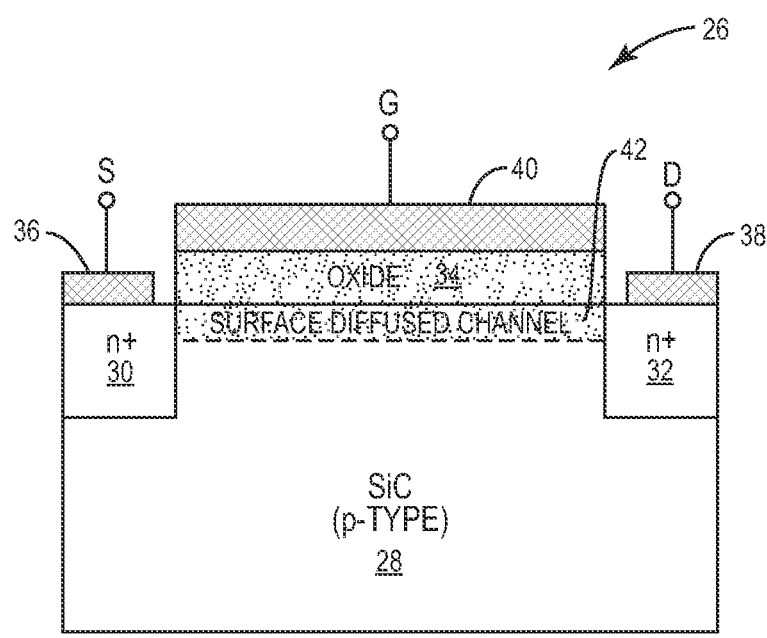

More specifically, first, the first and second n+ wells 30 and 32 and the oxide layer 44 are formed as illustrated in FIGS. 8A through 8C and described above with respect to FIGS. 3A through 3C. Next, in this embodiment, the structure of FIG. 8C is annealed in a N rich environment (e.g., an NO environment) such that N is incorporated into the oxide layer 44, as illustrated in FIG. 8D. Again, while N is utilized in this embodiment, another group V element other than P (e.g., Arsenic (As), Antimony (Sb), or Bismuth (Bi)) may alternatively be used. Next, as illustrated in FIG. 8E, P is diffused into the surface of the SiC substrate 28 through the oxide layer 44 to form the surface diffused channel 42 in the manner described above with respect to FIGS. 3D and 4. As a result of annealing in the N rich environment prior to P diffusion, the surface of the SiC substrate 28 is disrupted such that the P is enabled to more easily diffuse into the surface of the SiC substrate 28. Fabrication of the SiC MOSFET 26 is then completed by etching the oxide layer 44 to form the gate oxide 34 and then forming the source, drain, and gate contacts 36, 38, and 40 using conventional processes, as illustrated in FIG. 8F. Again, the source and drain contacts 36 and 38 are preferably formed of a metal, and the gate contact 40 is preferably formed of a metal or polysilicon.

In an alternative embodiment, after P diffusion in FIG. 8E, the oxide layer 44 may be removed and replaced with a new oxide layer such as the new oxide layer 46. A group V element or a combination of group V elements may then be incorporated into the new oxide layer in the manner described above with respect to FIGS. 6E and 6F. The new oxide layer may then be etched to form the gate oxide 34. The source, drain, and gate contacts 36, 38, and 40 are then fabricated to complete the SiC MOSFET 26.

FIGS. 9 and 10 graphically illustrate the improvement in carrier mobility and drain current for the SiC MOSFET 26 according to one exemplary embodiment. In this embodiment, the SiC MOSFET 26 is fabricated according to the process of FIGS. 7A through 7F where the P rich oxide layer 44 is utilized as the gate oxide 34. As illustrated, at a gate voltage of 15V, which is a typical operating voltage, the drain current for the SiC MOSFET 26 is approximately two times greater and the carrier mobility is approximately 1.5 to 2 times greater than that of the standard, or conventional, SiC MOSFET. Further, the carrier mobility of the SiC MOSFET 26 is greater than 50 $cm^2V^{-1}s^{-1}$ for a gate voltage in the range of approximately 1V to 6V.

FIGS. 11 and 12 graphically illustrate carrier mobility and drain current for the SiC MOSFET 26 according to another exemplary embodiment. In this embodiment, the SiC MOSFET 26 is fabricated according to the process of FIGS. 3A through 3G. As illustrated, the carrier mobility is about 10% higher for the SiC MOSFET 26 than for the standard SiC MOSFET at a gate voltage of 20V. Also, from FIG. 11, it is evident that the turn-on is sharper and the threshold voltage defined by the onset of conduction at 1 nA is 0.5V higher for the SiC MOSFET 26. Note that drain current may be further increased by incorporating one or more group V elements into the new oxide layer 46 as described above with respect to FIGS. 6A through 6H.

It should be noted that while the discussion herein focuses on a MOS device, such as the SiC MOSFET 26, including the surface diffused channel 42, the present disclosure is not limited thereto. The concepts discussed herein may also be applicable to other semiconductor devices in which a similar high performance channel is needed or desired. Further, in another embodiment, a MOS device, such as a SiC MOSFET, may be fabricated without the surface diffused channel 42 but where a combination of two or more group V elements (for an n-channel MOS device) or a combination of two or more group III elements (for a p-channel MOS device) are included in the gate oxide 34. Doing so substantially increases the current of the MOS device when in the on-state and thus substantially decreases the on-resistance of the MOS device. For example, the processes outlined above may be used to incorporate P and N into the gate oxide 34 of a MOS device without forming a surface diffused channel 42 (i.e., perform the process outlined above for a surface diffused channel depth of approximately 0).

Those skilled in the art will recognize improvements and modifications to the preferred embodiments of the present disclosure. All such improvements and modifications are considered within the scope of the concepts disclosed herein and the claims that follow.

What is claimed is:

1. A semiconductor device comprising:
   a substrate of a first conductivity type;
   a first well in the substrate, the first well being of a second conductivity type;
   a second well in the substrate, the second well being of the second conductivity type; and
   a surface diffused channel of the second conductivity type formed in the substrate between the first and second wells to a depth that is less than 750 Angstroms, wherein the depth and doping concentration of the surface diffused channel are such that a carrier mobility of the semiconductor device is significantly improved as compared to the semiconductor device without the surface diffused channel and the semiconductor device exhibits normally-off behavior.

2. The semiconductor device of claim 1 wherein the semiconductor device exhibits normally-off behavior by conducting less than or equal to 1/10,000th of a rated current of the semiconductor device when a control voltage of zero volts is applied to a control contact of the semiconductor device.

3. The semiconductor device of claim 1 wherein a dose of the surface diffused channel is in a range of and including 5e11 cm$^{-2}$ to 5e13 cm$^{-2}$.

4. The semiconductor device of claim 3 wherein the depth of the surface diffused channel is less than or equal to 500 Angstroms.

5. The semiconductor device of claim 4 wherein the doping concentration of the surface diffused channel is at least 5e17 cm$^{-3}$.

6. The semiconductor device of claim 5 wherein the first and second wells each have a depth within the substrate in a range of and including 2000 Angstroms to 3000 Angstroms and a doping concentration in a range of and including 1e$^{19}$ cm$^{-3}$ to 1e$^{21}$ cm$^{-3}$.

7. The semiconductor device of claim 1 wherein the carrier mobility of the semiconductor device is at least 10% greater than a carrier mobility of the semiconductor device without the surface diffused channel within a desired control voltage range.

8. The semiconductor device of claim 1 wherein the carrier mobility of the semiconductor device is at least 50 cm$^2$V$^{-1}$s$^{-1}$ within a desired control voltage range.

9. The semiconductor device of claim 1 wherein the carrier mobility of the semiconductor device is at least 50 cm$^2$V$^{-1}$s$^{-1}$ for a control voltage applied to the semiconductor device within a range of and including 2 to 6 Volts.

10. The semiconductor device of claim 1 wherein the semiconductor device is an n-channel semiconductor device, the substrate is a p-type Silicon Carbide (SiC) substrate, and the surface diffused channel is a region of the p-type SiC substrate in which a group V element has been diffused to counter-dope the region of the p-type SiC substrate from p-type to n-type.

11. The semiconductor device of claim 10 wherein the group V element diffused into the p-type SiC substrate to form the surface diffused channel is Phosphorus.

12. The semiconductor device of claim 11 further comprising a control contact insulator on the substrate between the first and second wells, wherein one or more group V elements are incorporated into the control contact insulator.

13. The semiconductor device of claim 12 wherein the one or more group V elements are one or more group V elements other than Phosphorus.

14. The semiconductor device of claim 12 wherein the one or more group V elements are two or more group V elements comprising Phosphorus.

15. The semiconductor device of claim 12 wherein the one or more group V elements comprise Nitrogen.

16. The semiconductor device of claim 1 wherein the semiconductor device is a p-channel semiconductor device, the substrate is an n-type Silicon Carbide (SiC) substrate, and the surface diffused channel is a region of the n-type SiC substrate in which a group III element has been diffused to counter-dope the region of the n-type SiC substrate from n-type to p-type.

17. The semiconductor device of claim 16 further comprising a control contact insulator on the substrate between the first and second wells, wherein one or more group III elements are incorporated into the control contact insulator.

18. The semiconductor device of claim 17 wherein the one or more group III elements are one or more group III elements other than the group III element diffused into the n-type SiC substrate to form the surface diffused channel.

19. The semiconductor device of claim 17 wherein the one or more group III elements are two or more group III elements including the group III element diffused into the n-type SiC substrate to form the surface diffused channel.

20. The semiconductor device of claim 1 wherein the semiconductor device is a Metal-Oxide-Semiconductor (MOS) device.

21. The semiconductor device of claim 1 further comprising a control contact insulator on the substrate between the first and second wells.

22. A method of fabrication of a semiconductor device on a substrate of a first conductivity type, comprising:
   providing a first well in the substrate, the first well being of a second conductivity type;
   providing a second well in the substrate, the second well being of the second conductivity type;
   providing an insulation layer on the substrate between the first and second wells;
   diffusing a predetermined dopant into a surface of the substrate through the insulation layer, the predetermined dopant forming a surface diffused channel of the second conductivity type in the substrate between the first and second wells, wherein diffusing the predetermined dopant into the surface of the substrate through the insulation layer to form the surface diffused channel comprises annealing the substrate including the insulation layer formed on the substrate where the depth and doping concentration of the surface diffused channel are such that a carrier mobility of the semiconductor device is significantly improved as compared to the semiconductor device without the surface diffused channel and the semiconductor device exhibits normally-off behavior.

23. The method of claim 22 wherein the semiconductor device exhibits normally-off behavior by conducting less than or equal to 1/10,000th of a rated current of the semiconductor device when a control voltage of zero volts is applied to a control contact of the semiconductor device.

24. The method of claim 22 wherein diffusing the predetermined dopant into the surface of the substrate through the insulation layer and annealing the substrate including the insulation layer formed on the substrate further comprises annealing the substrate including the insulation layer in an environment rich with the predetermined dopant at a predetermined temperature for a predetermined amount of time, wherein the predetermined temperature and the predetermined amount of time are selected such that the predetermined dopant diffuses into the surface of the substrate to a desired depth and a desired doping concentration that significantly improve the carrier mobility of the semiconductor device as compared to the semiconductor device without the surface diffused channel while retaining normally-off behavior.

25. The method of claim 22 wherein diffusing the predetermined dopant into the surface of the substrate through the insulation layer to form the surface diffused channel comprises:
annealing the substrate including the insulation layer formed on the substrate in an environment rich with the predetermined dopant at a first predetermined temperature for a first predetermined amount of time;
removing the substrate including the insulation layer formed on the substrate from the environment rich with the predetermined dopant; and
annealing the substrate including the insulation layer formed on the substrate at a second predetermined temperature that is higher than the first predetermined temperature for a second predetermined amount of time;
wherein the first and second predetermined temperatures and the first and second predetermined amounts of time are selected such that the predetermined dopant diffuses into the surface of the substrate to a desired depth and a desired doping concentration that significantly improve the carrier mobility of the semiconductor device as compared to the semiconductor device without the surface diffused channel while retaining normally-off behavior.

26. The method of claim 22 wherein the semiconductor device is an n-channel semiconductor device, and the predetermined dopant diffused into the surface of the substrate to form the surface diffused channel is a group V element.

27. The method of claim 26 wherein the predetermined dopant is Phosphorus.

28. The method of claim 27 wherein diffusing the predetermined dopant into the surface of the substrate through the insulation layer to form the surface diffused channel comprises annealing the substrate including the insulation layer formed on the substrate in a Phosphorus rich environment.

29. The method of claim 28 wherein the Phosphorus rich environment is a $P_2O_5$ environment.

30. The method of claim 26 further comprising:
incorporating a second group V element into the insulation layer; and
etching the insulation layer to form a control contact insulator on the surface of the substrate between the first and second wells.

31. The method of claim 30 wherein the predetermined dopant diffused into the surface of the substrate to form the surface diffused channel is Phosphorus and the second group V element is a group V element other than Phosphorus.

32. The method of claim 31 wherein the second group V element is Nitrogen, and incorporating the second group V element into the insulation layer comprises annealing the substrate including the insulation layer formed on the surface of the substrate in a Nitrogen rich environment.

33. The method of claim 26 further comprising:
removing the insulation layer after diffusing the predetermined dopant into the surface of the substrate through the insulation layer to form the surface diffused channel;
providing a new insulation layer on the surface of the substrate; and
etching the new insulation layer to form a control contact insulator on the surface of the substrate between the first and second wells.

34. The method of claim 33 wherein the predetermined dopant is Phosphorus.

35. The method of claim 26 further comprising:
removing the insulation layer after diffusing the predetermined dopant into the surface of the substrate through the insulation layer to form the surface diffused channel;
providing a new insulation layer on the surface of the substrate;
incorporating a second group V element into the new insulation layer; and
etching the new insulation layer to form a control contact insulator on the surface of the substrate between the first and second wells.

36. The method of claim 35 wherein the predetermined dopant diffused into the surface of the substrate to form the surface diffused channel is Phosphorus and the second group V element is a group V element other than Phosphorus.

37. The method of claim 36 wherein the second group V element is Nitrogen, and incorporating the second group V element into the new insulation layer comprises annealing the substrate including the new insulation layer formed on the surface of the substrate in a Nitrogen rich environment.

38. The method of claim 22 wherein a dose of the surface diffused channel is in a range of and including 5e11 $cm^{-2}$ to 5e13 $cm^{-2}$.

39. The method of claim 38 wherein the depth of the surface diffused channel is less than or equal to 500 Angstroms.

40. The method of claim 39 wherein the doping concentration of the surface diffused channel is at least 5e17 $cm^{-3}$.

41. The method of claim 22 wherein the semiconductor device is an n-channel semiconductor device and the predetermined dopant diffused into the surface of the substrate is Phosphorus, and the method further comprises:
prior to diffusing the Phosphorus into the surface of the substrate through the insulation layer to form the surface diffused channel in the substrate below the insulation layer between the first and second wells, incorporating a second group V element other than Phosphorus into the insulation layer.

42. The method of claim 41 wherein the second group V element is Nitrogen.

43. The method of claim 22 wherein the semiconductor device is a Metal-Oxide-Semiconductor (MOS) device.

44. A method of fabrication of a semiconductor device on a substrate of a first conductivity type, comprising:
providing a first well in the substrate, the first well being of a second conductivity type;
providing a second well in the substrate, the second well being of the second conductivity type;
providing a layer on a surface of the substrate between the first and second wells; diffusing Phosphorus into the layer from a $P_2O_5$ source such that Phosphorus diffuses into the layer up to at least an interface between the substrate and the layer; and etching the layer to form a control contact insulator layer of the semiconductor device on the surface of the substrate between the first and second wells.

45. The method of claim 44 wherein the substrate is a Silicon Carbide (SiC) substrate.

46. The method of claim 44 wherein the semiconductor device is a Metal-Oxide-Semiconductor (MOS) device.

* * * * *